(12) United States Patent
Leggette et al.

(10) Patent No.: US 10,268,554 B2
(45) Date of Patent: Apr. 23, 2019

(54) USING DISPERSED COMPUTATION TO CHANGE DISPERSAL CHARACTERISTICS

(71) Applicant: International Business Machines Corporation, Armonk, NY (US)

(72) Inventors: Wesley B. Leggette, Chicago, IL (US); Andrew D. Baptist, Mt. Pleasant, WI (US); Greg R. Dhuse, Chicago, IL (US); Jason K. Resch, Chicago, IL (US); Gary W. Grube, Barrington Hills, IL (US); S. Christopher Gladwin, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/823,811

(22) Filed: Nov. 28, 2017

(65) Prior Publication Data
US 2018/0081769 A1    Mar. 22, 2018

Related U.S. Application Data

(63) Continuation-in-part of application No. 14/102,987, filed on Dec. 11, 2013, now Pat. No. 10,055,441.
(Continued)

(51) Int. Cl.
*G06F 7/02* (2006.01)
*G06F 17/30* (2006.01)
(Continued)

(52) U.S. Cl.
CPC .......... *G06F 11/1666* (2013.01); *G06F 3/067* (2013.01); *G06F 11/1076* (2013.01);
(Continued)

(58) Field of Classification Search
CPC ........ G06F 17/30345; G06F 17/30312; G06F 3/0629; G06F 17/30194; G06F 17/30283;
(Continued)

(56) References Cited

U.S. PATENT DOCUMENTS

| 4,092,732 A | 5/1978 | Ouchi |
| 5,454,101 A | 9/1995 | Mackay et al. |

(Continued)

OTHER PUBLICATIONS

Shamir; How to Share a Secret; Communications of the ACM; vol. 22, No. 11; Nov. 1979; pp. 612-613.
(Continued)

*Primary Examiner* — Bruce M Moser
(74) *Attorney, Agent, or Firm* — Garlick & Markison; Timothy W. Markison; Timothy D. Taylor (57) ABSTRACT

A method begins by determining an encoding modification for a set of encoded data slices. The method continues by determining a plurality of tasks for executing the encoding modification. The method continues by dividing a first task of the plurality of tasks into one or more partial tasks based on the first task and assigning a first partial task of the one or more partial tasks to a first storage unit. The method continues by dividing a second task of the plurality of tasks into a plurality of partial tasks based on the second task and assigning the plurality of partial tasks to a set of storage units. The method continues by executing, by the first storage unit and at least some storage units of the set of storage units, the first partial task and the plurality of partial tasks, respectively, to produce a modified set of encoded data slices.

16 Claims, 7 Drawing Sheets

Related U.S. Application Data (60) Provisional application No. 61/760,962, filed on Feb. 5, 2013.

(51) Int. Cl.
  *G06F 11/16*  (2006.01)
  *G06F 3/06*  (2006.01)
  *G06F 11/10*  (2006.01)
  *H04L 29/08*  (2006.01)
  *H03M 13/15*  (2006.01)
  *G06Q 30/04*  (2012.01)

(52) U.S. Cl.
  CPC .. *G06F 17/30115* (2013.01); *G06F 17/30345* (2013.01); *G06F 17/30365* (2013.01); *G06F 3/0614* (2013.01); *G06Q 30/04* (2013.01); *H03M 13/1515* (2013.01); *H04L 67/1097* (2013.01)

(58) Field of Classification Search
  CPC . G06F 3/0631; G06F 15/177; H04L 67/1097; H04L 2209/34
  See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 8,335,918 B2 | 12/2012 | Shon et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma et al. |
| 2005/0015471 A1 | 1/2005 | Zhang |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula, Jr. |
| 2005/0132070 A1 | 6/2005 | Redlich et al. |
| 2005/0144382 A1 | 6/2005 | Schmisseur |
| 2005/0229069 A1 | 10/2005 | Hassner |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll, Jr. |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters, III et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |
| 2013/0031256 A1 | 1/2013 | Hampel |
| 2013/0031414 A1 | 1/2013 | Dhuse et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

(56) References Cited

OTHER PUBLICATIONS

Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

USING DISPERSED COMPUTATION TO CHANGE DISPERSAL CHARACTERISTICS

CROSS-REFERENCE TO RELATED APPLICATIONS

The present U.S. Utility Patent Application claims priority pursuant to 35 U.S.C. § 120 as a continuation-in-part of U.S. Utility application Ser. No. 14/102,987, entitled "UPDATING SHARED GROUP INFORMATION IN A DISPERSED STORAGE NETWORK", filed Dec. 11, 2013, which claims priority pursuant to 35 U.S.C. § 119(e) to the following U.S. Provisional Patent Application No. 61/760, 962, entitled "MANAGING A DISPERSED STORAGE NETWORK POWER CONSUMPTION", filed Feb. 5, 2013, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

DETAILED DESCRIPTION OF THE INVENTION

Figure 1:
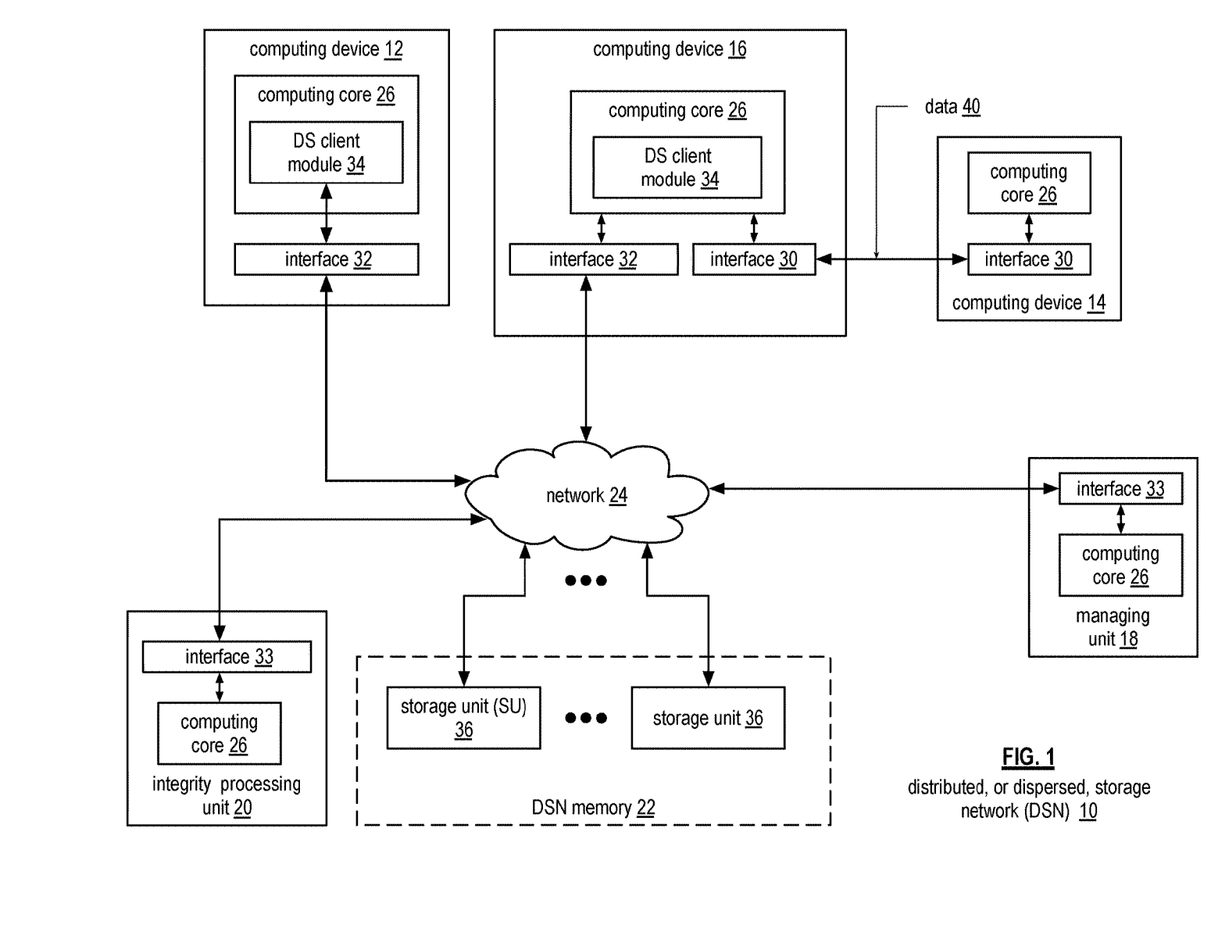
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
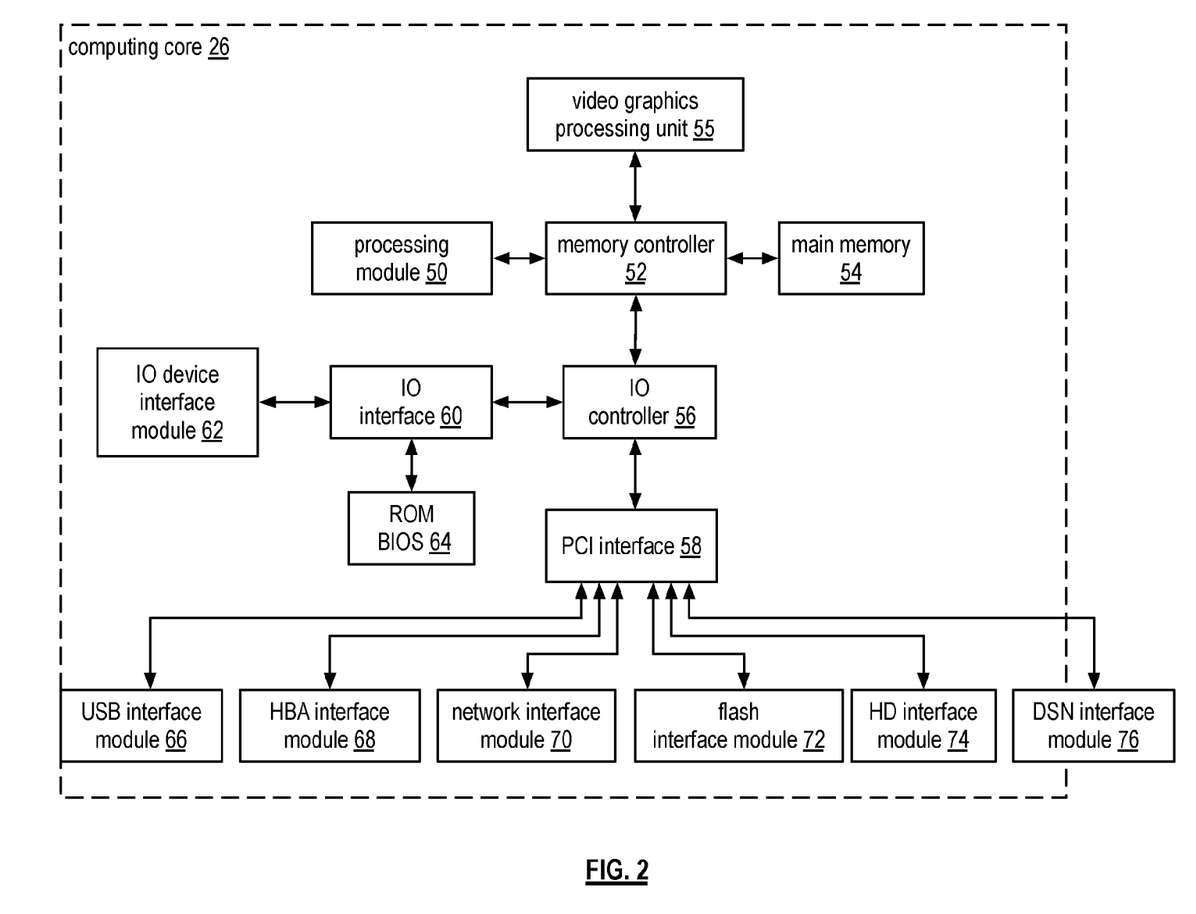
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 & 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data as subsequently described with reference to one or more of FIGS. 3-8. In this example embodiment, computing device 16 functions as a dispersed storage processing agent for computing device 14. In this role, computing device 16 dispersed storage error encodes and decodes data (e.g., data 40) on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSTN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The DSN managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The DSN managing unit 18 creates billing information for a particular user, a user group, a vault access, public vault access, etc. For instance, the DSTN managing unit 18 tracks the number of times a user accesses a non-public vault and/or public vaults, which can be used to generate a per-access billing information. In another instance, the DSTN managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSTN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

Figure 3:
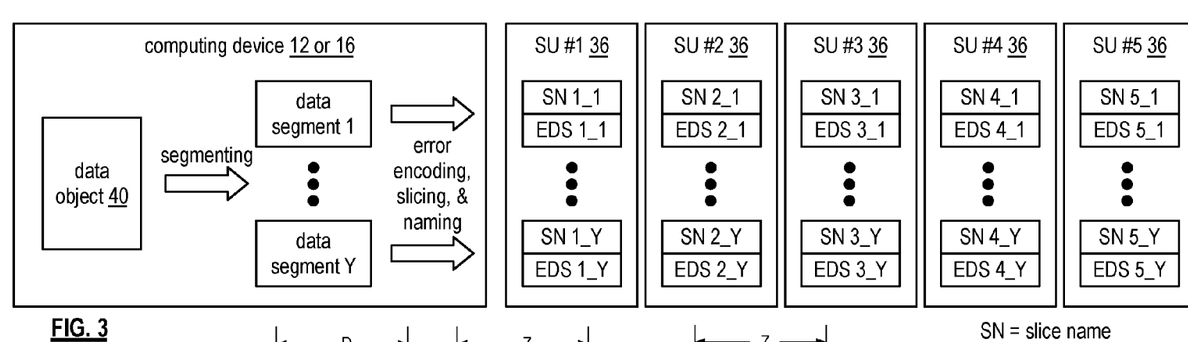
FIG. 3 is a schematic block diagram of an example of dispersed storage error encoding of data in accordance with the present invention.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

Figures 4, 5:
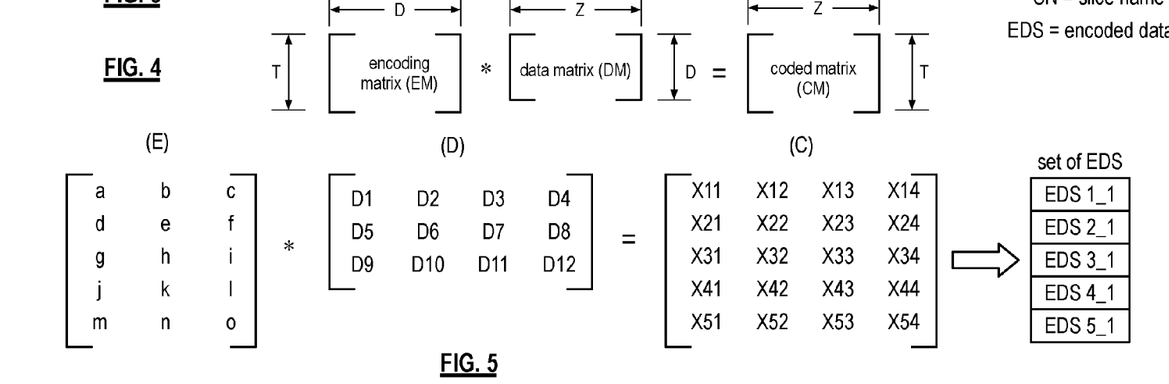
FIG. 4 is a schematic block diagram of a generic example of an error encoding function in accordance with the present invention.
FIG. 5 is a schematic block diagram of a specific example of an error encoding function in accordance with the present invention.

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Figure 6:
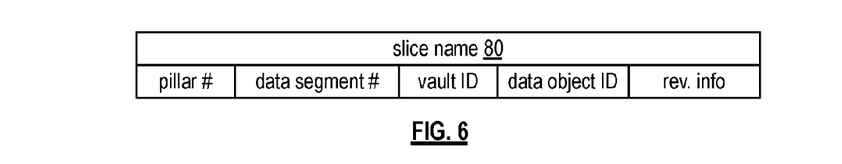
FIG. 6 is a schematic block diagram of an example of a slice name of an encoded data slice (EDS) in accordance with the present invention.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
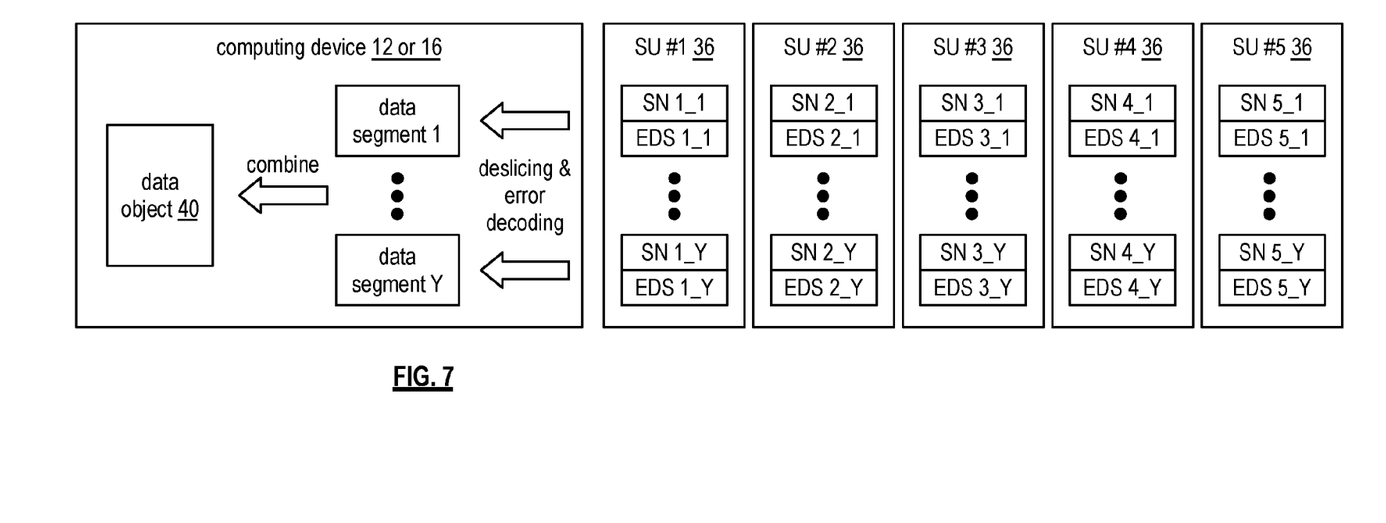
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
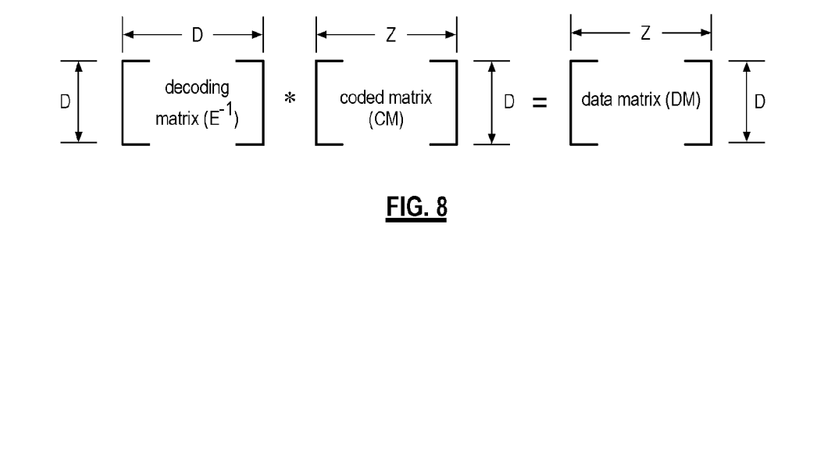
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
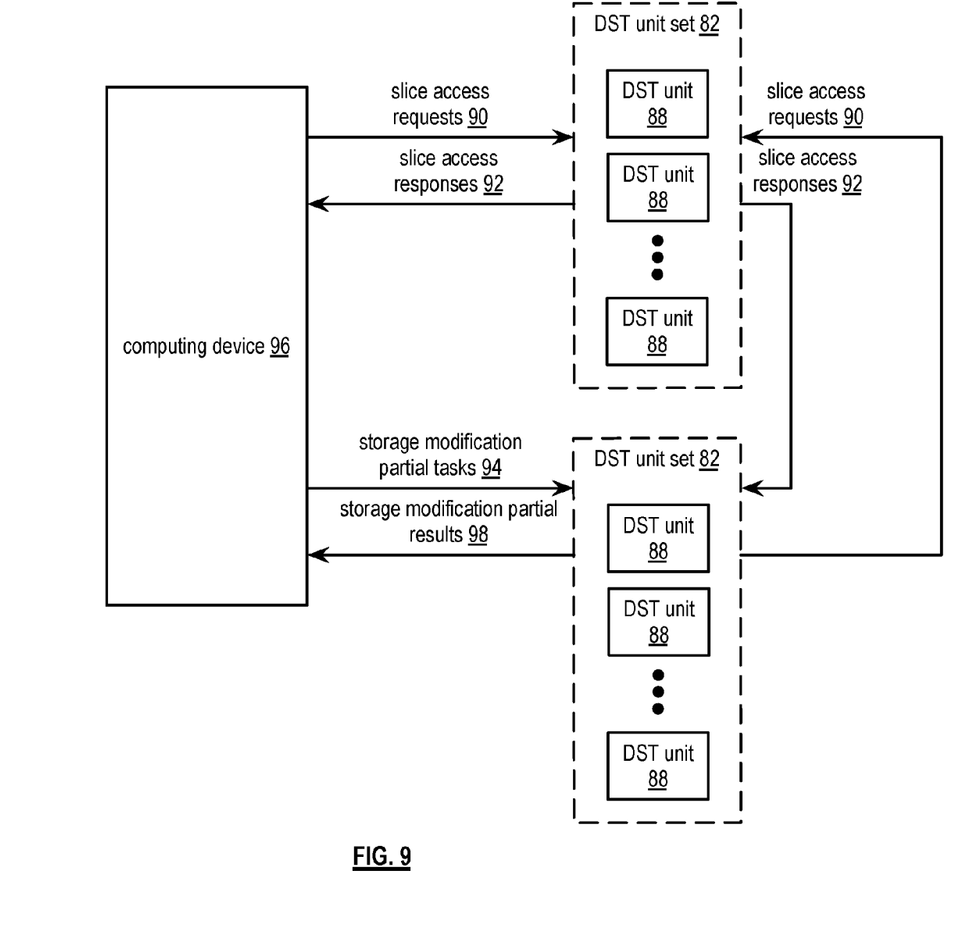
FIG. 9 is a schematic block diagram of an embodiment of a distributed computing system in accordance with the present invention.

FIG. 9 is a schematic block diagram of an embodiment of a distributed computing system that includes a computing device 96 and the at least two distributed storage and task (DST) unit sets 88. The computing device may be implemented utilizing one or more of the computing device 12-16 of FIG. 1, the storage unit 36 of FIG. 1, a DS unit, a storage server, a distributed computing server, a user device, a DS processing unit, and a DST unit 88 of the DST unit set 82. The DST unit 88 may be implemented by utilizing a storage unit 36 and DS client module of FIG. 1.

The system functions to modify storage of data in a first DST unit set 82 of the at least two DST unit sets 82 by utilizing a distributed computing storage modification process. The computing device 96 issues slice access requests 90 to the first DST unit set 82 and receives slice access responses 92. The computing device 96 identifies a data object stored as a plurality of sets of encoded data slices for the storage modification process based on the received slice access responses 92. For example, the computing device determines a measured reliability level based on the received slice access responses 92 and initiates the storage modification process to improve reliability when the measured reliability level compares unfavorably to a reliability level goal.

The computing device 96 determines one or more tasks of the storage modification process (e.g., retrieve slices, decode slices, re-encode slices, store slices). The determining may be based on one or more of a lookup, receiving a task list, generating the task list based on the received slice access responses. The computing device 96 partitions each of the one or more tasks to produce one or more storage modification partial tasks 94. The computing device 96 assigns each of the one or more storage modification partial tasks 94 to one or more DST units 88 of another DST unit set 82 of the two or more DST unit sets 82. Alternatively, the first DST unit set 82 includes at least one of the assigned one or more DST units 88. The computing device 96 outputs the storage modification partial tasks 94 to the assigned one or more DST units 88.

The assigned one or more DST units 88 execute the storage modification partial tasks 94 to produce storage modification partial results 98. The storage modification partial results 98 include one or more of a slice name of a slice to be generated, the retrieved slice, a newly generated slice, an error indicator, a set of modified slices, a set of newly generated slices, a data segment, and an indicator that the modified slices have been stored to retire the storage modification process. The assigned one or more DST units 88 may issue slice access requests 90 to the first DST unit set 82 and receive slice access responses 92 from the first DST unit set 82. The computing device 96 facilitates completion of the one or more tasks of the storage modification process utilizing the storage modification partial results 98. For example, the computing device 96 stores newly generated slices. As another example, the computing device 96 updates a storage location list.

Figure 10:
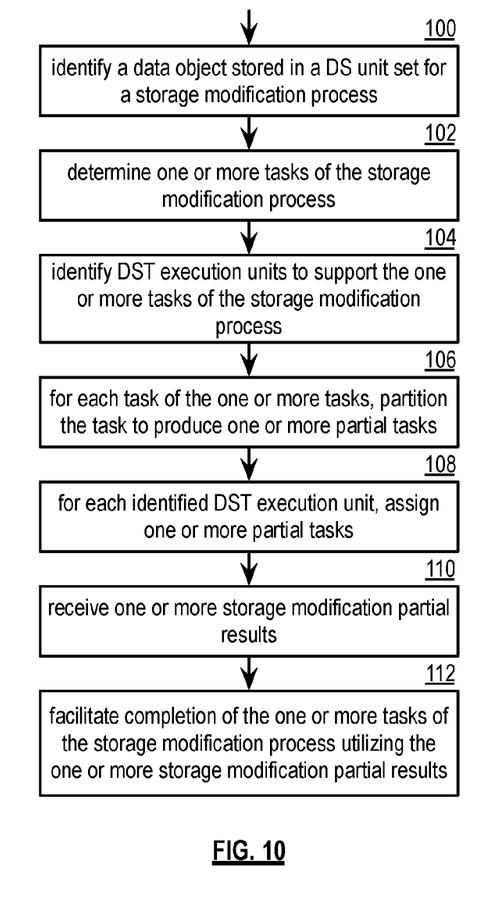
FIG. 10 is a logic diagram of an example of a method of modifying storage of data in accordance with the present invention.

FIG. 10 is a logic diagram illustrating an example of modifying storage of data. The method begins at step 100 where a processing module (e.g., of a computing device) identifies a data object stored in a dispersed storage (DS) unit set for a storage modification process. The identifying may be based on one or more of a measured reliability level, a goal reliability level, an actual storage efficiency level, and a goal storage efficiency level. The storage modification process may be invoked when more or less reliability is desired and/or more or less storage efficiency is desired. The method continues at step 102 where the processing module determines one or more tasks of the storage modification process. The determining includes identifying a new set of storage parameters and identifying the tasks to utilize the new set of storage parameters. For example, the processing module identifies the new set of storage parameters where a new pillar width is less than a previous pillar width when more storage efficiency is desired.

The method continues at step 104 where the processing module identifies distributed storage and task (DST) execution units to support the one or more tasks of the storage modification process. The identifying may be based on one or more of DST execution unit availability, an error message, and a DST execution unit encoding capability level. The method continues with steps 106 and 108, where for each task of the one or more tasks, the processing module partitions the task to produce one or more partial tasks and for each identified DST execution unit, the processing module assigns one or more partial tasks.

The method continues at step 110 where the processing module receives one or more storage modification partial results. The method continues at step 112 where the processing module facilitates completion of the one or more tasks of the storage modification process utilizing the one or more storage modification partial results. For example, the processing module stores new slices. As another example, the processing module updates a storage location table. As yet another example, the processing module issues a command to a DST execution unit to store a newly generated slice.

Figure 11:
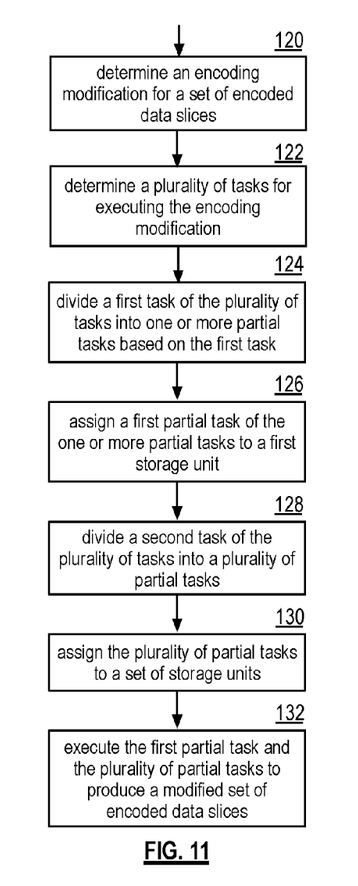
FIG. 11 is a logic diagram of an example of a method of changing dispersal characteristics in a dispersed storage network (DSN) in accordance with the present invention.

FIG. 11 is a logic diagram illustrating a method of changing dispersal characteristics in a dispersed storage network (DSN). The method begins with step 120, where a computing device of the DSN determines an encoding modification for a set of encoded data slices. Note to create the set of encoded data slices, a data segment of data is dispersed storage error encoded into the set of encoded data slices based on dispersed storage error encoding parameters. Note the encoding modification includes altering one or more parameters of the dispersed storage error encoding parameters. For example, the encoding modification for the set of encoded data slices may include one or more of deleting an encoded data slice(s), adding an encoded data slice(s), re-encoding the data segment using a new decode threshold, changing coefficients (e.g., a-o of FIG. 5) of an encoding matrix, and changing an encoding function (e.g., from Reed Solomon to Cauchy-Reed Solomon, etc.).

The determining the encoding modification may be based on determination factors, which include one or more of greater reliability, modifying a storage location, responding to new hardware, and changing a storage tier. For example, the determination factors may include changing storage of a set of encoded data slices from a cache (tier 1) to a hard drive (tier 2). As another example, determination factors may include changing storage from a magnetic tape (tier 3) to double-parity RAID (tier 1). As yet another example, the determination factors may include changing a physical address of an encoded data slice(s). As yet still a further example, the determination factors may include a new hard drive being added to a storage unit and a storage unit being added to the set of storage units.

The method continues with step 122, where the computing device determines a plurality of tasks for executing the encoding modification. As one example, when the encoding modification is to add an encoded data slice a first task may be obtaining a data matrix and a second task may be updating revision levels for the set of encoded data slices. The plurality of tasks may also include a plurality of intermediate tasks (e.g., between a start of execution of the first task and an end of execution of the second task). In this example, the first intermediate task is creating a new row of an encoding matrix, a second intermediate task is performing a matrix multiplication of the new row by the data matrix to produce the encoded data slice and a third intermediate task is storing the encoded data slice.

As another example of the plurality of intermediate tasks, when the encoding modification is to delete an encoded data slice, a first task may be identifying the encoded data slice and a second task may be updating slice names for the set of encoded data slices. In this example, a first intermediate task may be sending a delete command to a storage unit of the set of storage units that is storing the identified encoded data slice.

As yet another example of the plurality of intermediate tasks, when the encoding modification is to change an encoding matrix (e.g., changing due to a decode threshold change, changing due to different encoding function, etc.), the first task may be obtaining a data matrix and a second task may be updating revision levels for the set of encoded data slices. In this example, a first intermediate task may be creating a new encoding matrix, a second intermediate task may be performing a matrix multiplication of the new encoding matrix by the data matrix to produce a coded matrix, a third intermediate task may be transforming the coded matrix to produce the modified set of encoded data slices and a fourth intermediate task may be storing the modified set of encoded data slices. Each of the intermediate tasks may also include a plurality of partial intermediate tasks.

As an example of the plurality of partial intermediate tasks, the first intermediate task includes a plurality of partial first intermediate tasks. A first partial first intermediate task may be obtaining a first row of the new encoding matrix, a second partial first intermediate task may be obtaining a second row of the new encoding matrix and a third partial first intermediate task may be obtaining a third row of the new encoding matrix. As another example, the second intermediate task includes a plurality of partial second intermediate tasks. A first partial second intermediate task may be multiplying the first row of the new encoding matrix with the data matrix to produce a first new encoded data slice of the modified set of encoded data slices and a second partial second intermediate task may be multiplying the second row of the new encoding matrix with the data matrix to produce a second new encoded data slice of the modified set of encoded data slices.

The method continues with step 124, where the computing device divides a first task of the plurality of tasks into one or more partial tasks based on the first task. For example, when the first task is obtaining a data matrix, a first partial first task may be obtaining a first portion of a data matrix and a second partial first task may be obtaining a second portion of the data matrix.

The method continues with step 126, where the computing device assigns a first partial task of the one or more partial tasks to a first storage unit. The method continues with step 128, where the computing device divides a second task of the plurality of tasks into a plurality of partial tasks based on the second task. For example, a first partial second task may be updating a first slice name of a set of slice names and a second partial second task may be updating a second slice name of the set of slice names.

The method continues with step 130, where the computing device assigns the plurality of partial tasks to a set of storage units. For example, the first partial second task may be assigned to a first storage unit of the set of storage units and the second partial second task may be assigned to a second storage unit of the set of storage units.

The method continues with step 132, where the first storage unit and at least some storage units of the set of storage units execute the first partial task and the plurality of partial tasks, respectively, to produce a modified set of encoded data slices.

The respective storage units may then store or send to another storage unit for storage, an encoded data slice(s) of the modified set of encoded data slices.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   determining, by a computing device, an encoding modification for a set of encoded data slices, wherein a data segment of data is dispersed storage error encoded into the set of encoded data slices based on dispersed storage error encoding parameters;
   determining, by the computing device, a plurality of tasks for executing the encoding modification, wherein the encoding modification includes altering one or more parameters of the dispersed storage error encoding parameters;
   dividing, by the computing device, a first task of the plurality of tasks into one or more partial tasks based on the first task;
   assigning, by the computing device, a first partial task of the one or more partial tasks to a first storage unit;

dividing, by the computing device, a second task of the plurality of tasks into a plurality of partial tasks based on the second task;
assigning, by the computing device, the plurality of partial tasks to a set of storage units; and
executing, by the first storage unit and at least some storage units of the set of storage units, the first partial task and the plurality of partial tasks, respectively, to produce a modified set of encoded data slices.

2. The method of claim 1, wherein the encoding modification comprises one or more of:
deleting one or more encoded data slices;
adding one or more encoded data slices;
re-encoding the data segment using a new decode threshold;
changing coefficients of an encoding matrix; and
changing an encoding function.

3. The method of claim 1, wherein determination factors for the determining the encoding modification comprises:
comparing a measured reliability to a reliability threshold;
modifying a storage location;
responding to new hardware; and
changing a storage tier.

4. The method of claim 1, wherein when the encoding modification is to add an encoded data slice:
determining, by the computing device, the first task is obtaining a data matrix;
determining, by the computing device:
  a first intermediate task is creating a new row of an encoding matrix;
  a second intermediate task is performing a matrix multiplication of the new row by the data matrix to produce the encoded data slice; and
  a third intermediate task is storing the encoded data slice; and
determining, by the computing device, the second task is updating slice names for the set of encoded data slices.

5. The method of claim 1, wherein when the encoding modification is to delete an encoded data slice:
determining, by the computing device, the first task is identifying the encoded data slice;
determining, by the computing device:
  a first intermediate task is sending a delete command to a storage unit of the set of storage units that is storing the identified encoded data slice; and
determining, by the computing device, the second task is updating slice names for set of encoded data slices.

6. The method of claim 1, wherein when the encoding modification is to change an encoding matrix:
determining, by the computing device, the first task is obtaining a data matrix;
determining, by the computing device:
  a first intermediate task is creating a new encoding matrix;
  a second intermediate task is performing a matrix multiplication of the new encoding matrix by the data matrix to produce a coded matrix;
  a third intermediate task is transforming the coded matrix to produce the modified set of encoded data slices; and
  a fourth intermediate task is storing the modified set of encoded data slices; and
determining, by the computing device, the second task is updating slice names for the modified set of encoded data slices.

7. The method of claim 6 further comprises:
determining, by the computing device, the first intermediate task includes a plurality of partial first intermediate tasks, wherein the plurality of partial first intermediate tasks include a first partial first intermediate task of obtaining a first row of the new encoding matrix; and
determining, by the computing device, the second intermediate task includes a plurality of partial second intermediate tasks, wherein the plurality of partial second intermediate tasks include a first partial second intermediate task of multiplying the first row of the new encoding matrix with the data matrix to produce a first new encoded data slice of the modified set of encoded data slices.

8. The method of claim 7, wherein the plurality of partial first intermediate tasks includes a second partial first intermediate task of obtaining a second row of the new encoding matrix; and
the plurality of partial second intermediate tasks includes a second partial second intermediate task of multiplying the second row of the new encoding matrix with the data matrix to produce a second new encoded data slice of the modified set of encoded data slices.

9. A non-transitory computer readable storage device comprises:
a first memory section for storing operational instructions that when executed by a computing device of a dispersed storage network (DSN), cause the computing device to:
determine an encoding modification for a set of encoded data slices, wherein a data segment of data is dispersed storage error encoded into the set of encoded data slices based on dispersed storage error encoding parameters;
a second memory section for storing operational instructions, that when executed by the computing device, cause the computing device to:
determine a plurality of tasks for executing the encoding modification, wherein the encoding modification includes altering one or more parameters of the dispersed storage error encoding parameters;
a third memory section for storing operational instructions, that when executed by the computing device, cause the computing device to:
divide a first task of the plurality of tasks into one or more partial tasks based on the first task;
assign a first partial task of the one or more partial tasks to a first storage unit;
divide a second task of the plurality of tasks into a plurality of partial tasks based on the second task;
assign the plurality of partial tasks to a set of storage units; and
a fourth memory section for storing operational instructions, that when executed by the first storage unit and at least some storage units of the set of storage units, cause the first storage unit and at least some storage units of the set of storage units to:
execute the first partial task and the plurality of partial tasks, respectively, to produce a modified set of encoded data slices.

10. The non-transitory computer readable storage device of claim 9, wherein the encoding modification comprises one or more of:
deleting one or more encoded data slices;
adding one or more encoded data slices;
re-encoding the data segment using a new decode threshold;

changing coefficients of an encoding matrix; and
changing an encoding function.

11. The non-transitory computer readable storage device of claim 9, wherein determination factors for the determining the encoding modification comprises:
comparing a measured reliability to a reliability threshold;
modifying a storage location;
responding to new hardware; and
changing a storage tier.

12. The non-transitory computer readable storage device of claim 9, wherein the second memory section stores further operational instructions that, when the encoding modification is to add an encoded data slice, cause the computing device to:
determine the first task is obtaining a data matrix;
determine:
a first intermediate task is creating a new row of an encoding matrix;
a second intermediate task is performing a matrix multiplication of the new row by the data matrix to produce the encoded data slice; and
a third intermediate task is storing the encoded data slice; and
determine the second task is updating slice names for the set of encoded data slices.

13. The non-transitory computer readable storage device of claim 9, wherein the second memory section stores further operational instructions that, when the encoding modification is to delete an encoded data slice, cause the computing device to:
determine the first task is identifying the encoded data slice;
determine a first intermediate task is sending a delete command to a storage unit of the set of storage units that is storing the identified encoded data slice; and
determine the second task is updating slice names for set of encoded data slices.

14. The non-transitory computer readable storage device of claim 9, wherein the second memory section stores further operational instructions that, when the encoding modification is to change an encoding matrix, cause the computing device to:
determine the first task is obtaining a data matrix;
determine:
a first intermediate task is creating a new encoding matrix;
a second intermediate task is performing a matrix multiplication of the new encoding matrix by the data matrix to produce a coded matrix;
a third intermediate task is transforming the coded matrix to produce the modified set of encoded data slices; and
a fourth intermediate task is storing the modified set of encoded data slices; and
determine the second task is updating slice names for the modified set of encoded data slices.

15. The non-transitory computer readable storage device of claim 14 further comprises:
a fifth memory section for storing operational instructions, that when executed by the computing device, cause the computing device to:
determine the first intermediate task includes a plurality of partial first intermediate tasks, wherein the plurality of partial first intermediate tasks include a first partial first intermediate task of obtaining a first row of the new encoding matrix; and
determine the second intermediate task includes a plurality of partial second intermediate tasks, wherein the plurality of partial second intermediate tasks include a first partial second intermediate task of multiplying the first row of the new encoding matrix with the data matrix to produce a first new encoded data slice of the modified set of encoded data slices.

16. The non-transitory computer readable storage device of claim 15, wherein the fifth memory section stores further operational instructions that when executed by the computing device, cause the computing device to:
determine the plurality of partial first intermediate tasks includes a second partial first intermediate task of obtaining a second row of the new encoding matrix; and
determine the plurality of partial second intermediate tasks includes a second partial second intermediate task of multiplying the second row of the new encoding matrix with the data matrix to produce a second new encoded data slice of the modified set of encoded data slices.

* * * * *